(12) United States Patent
Chien et al.

(10) Patent No.: US 9,368,226 B2
(45) Date of Patent: Jun. 14, 2016

(54) DATA STORAGE DEVICE AND METHOD FOR RESTRICTING ACCESS THEREOF

(71) Applicant: Silicon Motion, Inc., Jhubei (TW)

(72) Inventors: Jieh-Hsin Chien, Taoyuan (TW); Yi-Hua Pao, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 67 days.

(21) Appl. No.: 14/330,566

(22) Filed: Jul. 14, 2014

(65) Prior Publication Data

US 2015/0046762 A1 Feb. 12, 2015

Related U.S. Application Data

(60) Provisional application No. 61/862,858, filed on Aug. 6, 2013.

(30) Foreign Application Priority Data

Dec. 17, 2013 (TW) .............................. 102146530 A

(51) Int. Cl.
*H03M 13/00* (2006.01)
*G11C 16/34* (2006.01)
(Continued)

(52) U.S. Cl.
CPC .............. *G11C 16/3418* (2013.01); *G11C 7/04* (2013.01); *G11C 7/24* (2013.01)

(58) Field of Classification Search
CPC ......... G11C 16/3418; G11C 7/04; G11C 7/24
See application file for complete search history.

(56) References Cited

U.S. PATENT DOCUMENTS

| 6,396,744 | B1 | 5/2002 | Wong |
| 6,426,893 | B1 * | 7/2002 | Conley ................ G06F 12/0246 365/185.09 |
| 7,079,422 | B1 | 7/2006 | Wong |

(Continued)

FOREIGN PATENT DOCUMENTS

| JP | 2008310888 A | 12/2008 |
| JP | 2009026119 A | 2/2009 |

(Continued)

OTHER PUBLICATIONS

Yu Cai et al.; "Flash Correct-and-Refresh: Retention-Aware Error Management for Increased Flash Memory Lifetime".
(Continued)

*Primary Examiner* — Esaw Abraham
(74) *Attorney, Agent, or Firm* — Wang Law Firm, Inc.

(57) ABSTRACT

A data storage device including a flash memory, a temperature sensor and a controller. The flash memory has a plurality of blocks, and each of the blocks has a plurality of pages. The temperature sensor detects surrounding ambient temperature and to produce a temperature parameter accordingly. The controller is arranged to perform a first maintenance procedure after a predetermined period since the data storage device is powered on. The controller reads the temperature sensor to obtain a first temperature parameter in the first maintenance procedure and determines a first time span according to a first predetermined condition for performing a second maintenance procedure, wherein the first predetermined condition includes the first temperature parameter, and the controller is further arranged to perform the second maintenance procedure after the first time span since the first maintenance procedure has finished.

16 Claims, 3 Drawing Sheets

(51) Int. Cl.
  *G11C 7/04* (2006.01)
  *G11C 7/24* (2006.01)

(56) References Cited

U.S. PATENT DOCUMENTS

| | | | | |
|---|---|---|---|---|
| 8,116,160 | B2* | 2/2012 | Hwang | G06F 11/1068 365/185.22 |
| 8,542,537 | B2* | 9/2013 | Parker | G11C 16/10 365/185.24 |
| 8,745,314 | B1* | 6/2014 | Karamcheti | G06F 13/00 711/103 |
| 8,947,928 | B2* | 2/2015 | Kim | G11C 11/5642 365/185.03 |
| 2009/0296465 | A1* | 12/2009 | Wang | G11C 16/3454 365/185.2 |
| 2009/0327581 | A1 | 12/2009 | Coulson | |
| 2011/0219203 | A1 | 9/2011 | Nurminen et al. | |
| 2011/0302353 | A1 | 12/2011 | Confalonieri | |
| 2013/0007344 | A1 | 1/2013 | Belgar et al. | |
| 2013/0055046 | A1 | 2/2013 | Blodgett | |

FOREIGN PATENT DOCUMENTS

| | | |
|---|---|---|
| JP | 2009129070 A | 6/2009 |
| JP | 2009251627 A | 10/2009 |
| JP | 2010160816 A | 7/2010 |
| JP | 2011100519 A | 5/2011 |
| TW | 201027541 | 7/2010 |
| TW | 201037721 A1 | 10/2010 |
| TW | 201113694 A | 4/2011 |
| TW | 201145287 A | 12/2011 |
| TW | I355583 | 1/2012 |
| TW | 201232553 A1 | 8/2012 |
| TW | 201306032 A1 | 2/2013 |

OTHER PUBLICATIONS

Office Action of corresponding TW application, published on Mar. 9, 2015.
Office Action of corresponding JP application, published on Aug. 4, 2015.
Office Action of corresponding TW application, published on Sep. 18, 2014.

* cited by examiner

DATA STORAGE DEVICE AND METHOD FOR RESTRICTING ACCESS THEREOF

CROSS REFERENCE TO RELATED APPLICATIONS

This application claims priority to Taiwan Patent Application No. 102146530, filed on Dec. 17, 2013, the entirety of which is incorporated by reference herein. Furthermore, this application is a non-provisional of U.S. Provisional Application No. 61/862,858 filed on Aug. 6, 2013.

BACKGROUND OF THE INVENTION

1. Field of the Invention

The present invention relates to a data maintenance method applied to a memory device, and in particular to a data maintenance method capable of automatically monitoring flash memory.

2. Description of the Related Art

Flash memory is considered a non-volatile data storage device, using electrical methods to erase and program itself. Taking NAND Flash as an example, it is often used in memory cards, USB flash devices, solid state devices, eMMC and other uses.

Flash memory such as NAND Flash uses a multiple-block structure to store data, wherein the flash memory is constructed by floating gate transistors. The floating gates of the floating gate transistor may catch electronic charges for storing data. However, the floating gates may loss the electronic charges due to their operations, and the various environmental parameters of the flash memory, which can lead to read and write errors.

BRIEF SUMMARY OF THE INVENTION

A detailed description is given in the following embodiments with reference to the accompanying drawings.

The present invention provides a data storage device. The data storage device includes a flash memory, a temperature sensor and a controller. The flash memory has a plurality of blocks, and each of the blocks has a plurality of pages. The temperature sensor is arranged to detect surrounding ambient temperature and to produce a temperature parameter accordingly, wherein the temperature parameter changes with the detected surrounding ambient temperature. The controller is arranged to perform a first maintenance procedure after a predetermined period since the data storage device is powered on, wherein the controller is further arranged to read the temperature sensor to obtain a first temperature parameter in the first maintenance procedure, and determine a first time span according to a first predetermined condition for performing a second maintenance procedure, wherein the first predetermined condition includes the first temperature parameter, and the controller is further arranged to perform the second maintenance procedure after the first time span since the first maintenance procedure has finished.

The present invention further provides a data maintenance method applied to a data storage device of a flash memory, wherein the flash memory has a plurality of blocks, and each of the blocks has a plurality of pages. The data maintenance method includes: performing a first maintenance procedure after a predetermined period since the data storage device is powered on; reading a temperature sensor to obtain a first temperature parameter in the first maintenance procedure; determining a first time span according to a first predetermined condition in the first maintenance procedure for performing a second maintenance procedure, wherein the first predetermined condition includes the first temperature parameter; and performing the second maintenance procedure after the first time span since the first maintenance procedure has finished.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
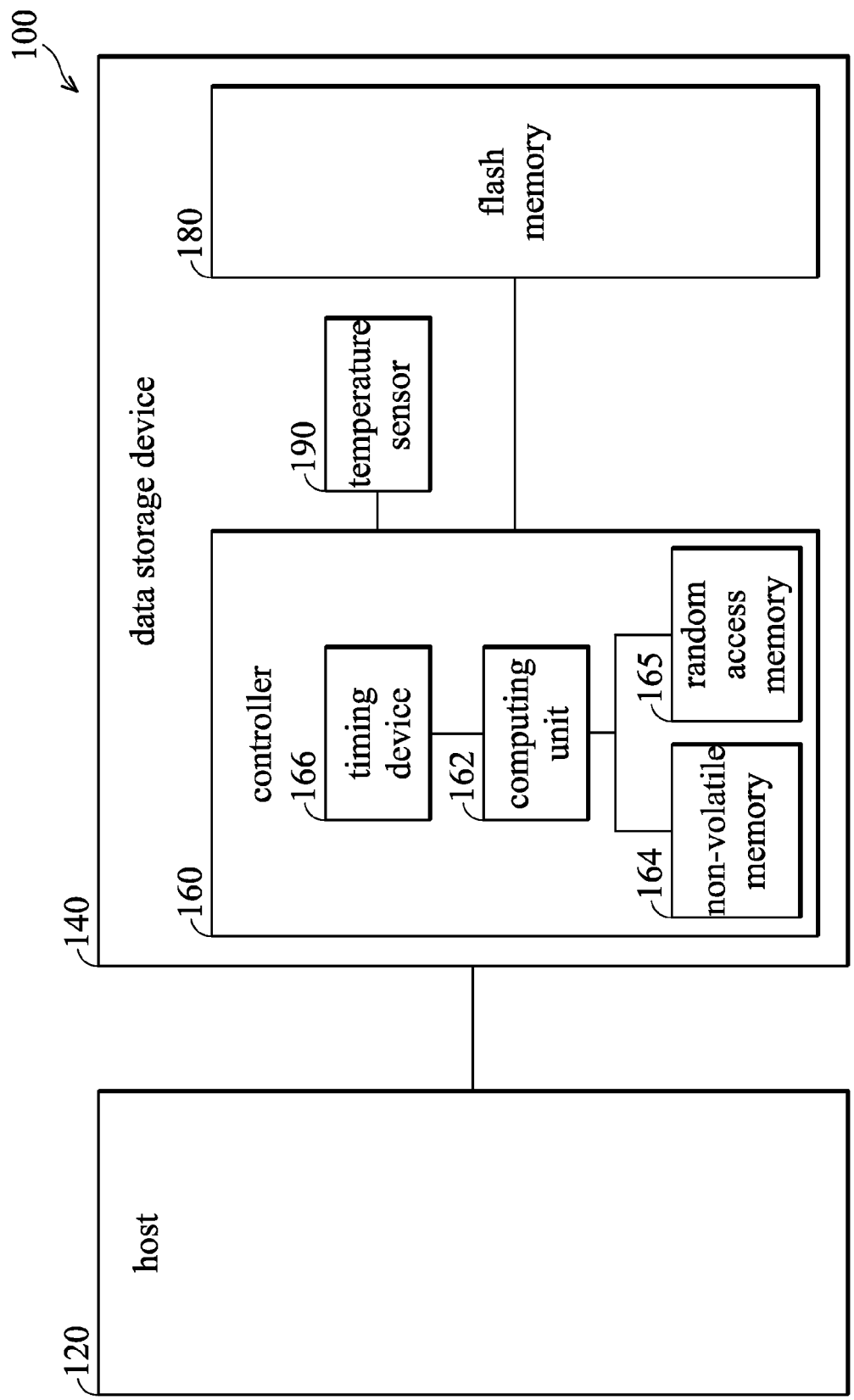
FIG. 1 is a schematic diagram illustrating an embodiment of an electronic system of the present invention.

FIG. 1 is a schematic diagram illustrating an embodiment of an electronic system of the present invention. The electronic system 100 includes a host 120 and a data storage device 140. The data storage device 140 includes a controller 160, a flash memory 180 and a temperature sensor 190. Furthermore, the data storage device 140 may operate in response to the commands received from the host 120. The controller 160 includes a computing unit 162, a non-volatile memory 164 (such as read only memory), a random access memory 165 and a timing device 166. The program code and data stored in the nonvolatile memory 164 may constitute firmware, and be performed by the computing unit 162, such that the controller 160 may control the flash memory 180 by the firmware. For example, the controller 160 may access the flash memory 180 according to the commands received from the host device 120 and automatically perform the maintenance procedure of the present invention. It should be noted that, in one of the embodiments, the maintenance procedure is performed in the background repeatedly. For example, the controller 160 only performs the maintenance procedure when it is idle, and discontinues the maintenance procedure when receiving commands from the host 120 until the works corresponding to the received command has finished. The flash memory 180 has a plurality of blocks, and each of the blocks has a plurality of pages. The timing device 166 is arranged to record the time that the data storage device 180 was powered on, and the time period between the procedures, etc. The temperature sensor 190 is arranged to detect the surrounding ambient temperature of the data storage device 140, and produce temperature parameters in response to the variation of the surrounding ambient temperature. In this embodiment, the temperature sensor 190 is implemented next to the flash memory 180 of the data storage device 140 and arranged to detect the surrounding ambient temperature of the flash memory 180, but it is not limited thereto. In another embodiment, the temperature sensor 190 may be implemented outside of the data storage device 140 and arranged to detect the surrounding ambient temperature of the data storage device 140.

Moreover, the flash memory 180 is further arranged to store at least one parameter table and at least one scan condition table. In one embodiment, the parameter table is arranged to store the time spans corresponding to the different surrounding ambient temperatures, wherein the time spans are arranged to determine the time interval between the current maintenance procedure and the next maintenance procedure, but it is not limited thereto. In other embodiments, the parameter table further includes the time spans corresponding to the different surrounding ambient temperatures, the different error bit values, the different numbers of the erased blocks, the different times of the last time that the data storage device 140 has been accessed by the host 120, the different time spans after the data storage device 140 has been powered on, and/or the number of times that the blocks have been erased, wherein the stored time spans are arranged to enable the next maintenance procedure. The scan condition table is arranged to store the scan condition corresponding to the different error bit values and/or the different numbers updated blocks. For example, the scan condition may be the threshold of error bit value, but it is not limited thereto. In other embodiments, the scan condition may be the different ECC code. In another embodiment, the flash memory 180 is arranged to store a parameter function and a scan condition function. In this embodiment, the time span between the previous maintenance procedure and the next maintenance procedure is determined by the parameter function. For example, the parameter function calculates the time span between the current maintenance procedure and the following maintenance procedure from the different surrounding ambient temperature values, but it is not limited thereto. In other embodiments, the parameter function is further arranged to calculate the time span between the current maintenance procedure and the following maintenance procedure according to the different surrounding ambient temperatures, the different error bit values, the number of the updated blocks, the different times of the last time that the data storage device 140 has been accessed by the host 120, the different time spans after the data storage device 140 has been powered on and/or the different numbers of times that the blocks are erased. Moreover, the scan condition function is further arranged to determine the different scan conditions according to the different error bit values and/or the number of the updated blocks. It should be noted that higher surrounding ambient temperatures mean higher error bit values, higher numbers of the updated blocks, longer times that the data storage device 140 has been powered on and higher numbers of times that the blocks have been erased have shorter time spans between the current maintenance procedure and the following maintenance procedure. Higher error bit values and higher numbers of updated blocks correspond to lower thresholds of error bit value.

In one embodiment, the controller 160 is arranged to perform a first maintenance procedure after a predetermined period since the data storage device 140 is powered on. In this embodiment, the predetermined period is a predetermined time, but it is not limited thereto. For example, the predetermined period may be 4 minutes or 5 minutes, but it is not limited thereto. In the first maintenance procedure, the controller 160 reads the temperature sensor 190 to obtain a first temperature parameter and determines a first time span according to a first predetermined condition for performing a first block scan on the blocks to obtain a plurality of first error bit values corresponding to the blocks, respectively. In one embodiment, the first predetermined condition includes the first temperature parameter, but it is not limited thereto. In another embodiment, the first predetermined condition may further include the time of the last time that the data storage device 140 was accessed by the host 120, the time that the data storage device 140 has been powered on and/or the number of times that the blocks have been erased. The controller 160 may determine the first time span in the first maintenance procedure according to the parameter table or the parameter function, such that the controller 160 can perform the second maintenance procedure after the first time span since the first maintenance procedure has finished. It should be noted that the parameters of the first predetermined condition are the current detected parameters. Therefore, the parameters of the first maintenance procedure may be different from the parameters of the second maintenance procedure, and the parameters of the second maintenance procedure may be different from the parameters of the third maintenance procedure. In some conditions, the different maintenance procedures may have the same parameters. For example, the number of times that the blocks have been erased in the second maintenance procedure and the third maintenance procedure are the same when the host 120 does not erase the blocks of the flash memory 180 between the second maintenance procedure and the third maintenance procedure. Conversely, the number of the times that the blocks have been erased in the second maintenance procedure is different from the number of the times that the blocks have been erased in the third maintenance procedure when the host 120 erases the blocks of the flash memory 180 between the second maintenance procedure and the third maintenance procedure. It should be noted that the controller 160 is further arranged to update at least one block when the corresponding first error bit value corresponding to the least one block is greater than a predetermined threshold of error bit value. In this embodiment, the predetermined threshold of error bit value is a predetermined threshold, but it is not limited thereto.

In another embodiment, in the predetermined period, the controller 160 is further arranged to read the temperature sensor 190 to obtain the current temperature parameter at a predetermined time interval, and adjust the time arranged to start the first maintenance procedure according to the current temperature parameter. Namely, the controller 160 is arranged to read the temperature sensor 190 to obtain the current temperature parameter at a predetermined time interval since the data storage device 140 is powered on, and determine the time arranged to start the first maintenance procedure by looking up the parameter table or the parameter function according to the current temperature parameter, wherein the span of the predetermined time interval is shorter than the predetermined period. For example, the predetermined period may be 1 second or 2 seconds, etc., but it is not limited thereto. When the determined time arranged to start the first maintenance procedure is less than the predetermined period, the controller 160 is further arranged to adjust the predetermined period according to the determined time arranged to start the first maintenance procedure. For example, the predetermined period may be 5 minutes, and the span of each predetermined time interval is 2 seconds. The controller 160 is arranged to read the temperature sensor 190 to obtain the current temperature parameter every 2 seconds for 5 minutes after the data storage device 140 is powered on, and determine the time arranged to enable the first maintenance procedure according to the current temperature parameter. For example, when the controller 160 determines that the first maintenance procedure should be started after 6 minutes (longer than the predetermined period) from the powering on of the data storage device 140, the controller 160 ignores the determined time (6 minutes) and repeats the steps of reading the temperature sensor 190 and determining the time span every 2 seconds until the predetermined period has ended. When the controller 160 determines that the first maintenance procedure should be started after 3 minutes (shorter than the predetermined period) from the data storage device 140 is powered on, the controller 160 adjusts the predetermined period to be 3 minutes and repeats the steps of reading the temperature sensor 190 and determining the time span every 2 seconds until the predetermined period has ended. Namely, the controller 160 performs the first maintenance procedure after 3 minutes since the data storage device 140 is powered on, and so on.

The controller 160 is further arranged to perform the second maintenance procedure after the first time span since the first maintenance procedure has finished. In the second maintenance procedure, the controller 160 reads the temperature sensor 190 to obtain a second temperature parameter, determines a second time span according to a second predetermined condition and a first history record to perform a third maintenance procedure, and determines a first threshold of error bit value according to the first history record to perform a second block scan on the blocks. In one embodiment, the second predetermined condition includes the second temperature parameter, and the first history record includes the first error bit values and the number of times that the blocks have been erased during the first maintenance procedure, but it is not limited thereto. In other embodiments, the second predetermined condition may further include the time of the last time that the data storage device 140 was accessed by the host 120, the time that the data storage device 140 have been powered on and/or the number of times that the blocks have been erased. The controller 160 may determine the second time span in the second maintenance procedure according to the parameter table or the parameter function, and perform the third maintenance procedure after the second time span since the second maintenance procedure has finished. It should be noted that the parameters of the first predetermined condition are the current detected parameters, and the operations of the third maintenance procedure and the second maintenance procedure are the same. Similarly, the third maintenance procedure may determine a third time span for determining the time arranged to start the fourth maintenance procedure, and determine a second threshold of error bit value for performing a third block scan on the blocks. The operations of the fourth maintenance procedure and the second maintenance procedure are the same, and so on. It should be noted that the controller 160 is further arranged to update the blocks when the second error bit values of the blocks is greater than a first threshold of error bit value.

It should be noted that the controller 160 may store the results of the block scan (such as the error bit values and/or the number of the updated blocks) or the number of times that the blocks have been erased (erase counts) in at least one specific block of the flash memory 180 for providing the maintenance procedure, but it is not limited thereto. In the block scan, the controller 160 is arranged to scan each of the blocks of the flash memory 180 to obtain the error bit values corresponding to the respective blocks. More specifically, the controller 160 is arranged to read each of the blocks of the flash memory 180 and obtain the error bit values of the Error Correction (ECC) of each block. Next, the controller 160 is further arranged to update the blocks when the corresponding error bit value is greater than a threshold, such as the predetermined threshold of error bit value, the first threshold of error bit value, and the second threshold of error bit value, etc. Furthermore, in the update procedure, the controller 160 is arranged to retrieve the data of the block, correct the retrieved data, and store the corrected data in another block of the flash memory 180. It should be noted that the threshold of error bit value is less than the maximum of the error bit value that can be corrected by the Error Correction (ECC). For example, the data can be correct by the Error Correction (ECC) when the error bit is less than 43 bits, and the threshold of error bit value may be 35 bit or 38 bit, but it is not limited thereto. Person with skill in the art may determine the predetermined threshold of error bit value according to the maximum of the error bit value that can be corrected by the Error Correction (ECC). For example, the predetermined threshold of error bit value can be the maximum of the error bit value that can be corrected by the Error Correction (ECC) or less than the maximum of the error bit value that can be corrected by the Error Correction (ECC).

Figure 2:
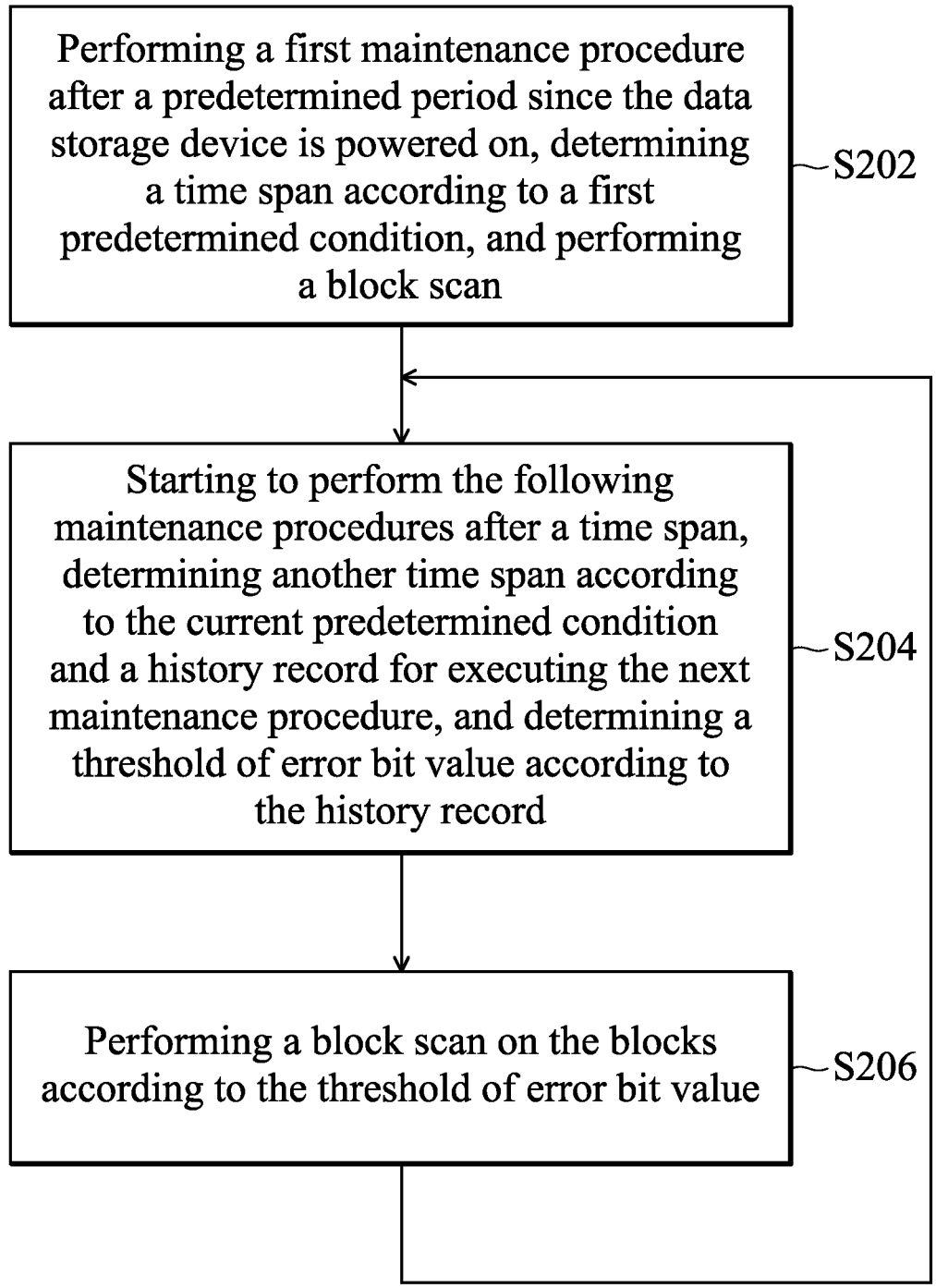
FIG. 2 is a flowchart of an access restriction method according to an embodiment of the present invention.

FIG. 2 is a flowchart of an access restriction method according to an embodiment of the present invention. The data maintenance method is applied to the data storage device 140 of FIG. 1. The process starts at step S202.

In step S202, the controller 160 is arranged to perform a first maintenance procedure after a predetermined period since the data storage device 140 is powered on. In this embodiment, the predetermined period is a predetermined time, but it is not limited thereto. For example, the predetermined period may be 4 minutes or 5 minutes, but it is not limited thereto. In the first maintenance procedure, the controller 160 reads the temperature sensor 190 to obtain a first temperature parameter and determines a first time span according to a first predetermined condition for performing a first block scan on the blocks to obtain a plurality of first error bit values corresponding to the blocks, respectively. In one embodiment, the first predetermined condition includes the first temperature parameter, but it is not limited thereto. In another embodiment, the first predetermined condition may further include the time of the last time that the data storage device 140 is accessed by the host 120, the time that the data storage device 140 has been powered on and/or the number of times that the blocks are erased. The controller 160 may determine the time span in the first maintenance procedure according to the parameter table or the parameter function, such that the controller 160 can perform the following maintenance procedures after the determined time span since the first maintenance procedure is finished, the following maintenance procedures may include the first maintenance procedure, the second maintenance procedure, and the third maintenance procedure, etc. It should be noted that the parameters of the first predetermined condition are the current detected parameters. It should be noted that the controller 160 is further arranged to update at least one block when the corresponding first error bit value corresponding to the at least one block is greater than a predetermined threshold of error bit value. In this embodiment, the predetermined threshold of error bit value is a predetermined threshold, but it is not limited to.

Next, after a time span, the controller 160 starts to perform the following maintenance procedures. For example, the controller 160 performs the second maintenance procedure after a time span determined by step S202 since the first maintenance procedure is finished. First, in step S204, the controller 160 reads the temperature sensor 190 to obtain the current temperature parameter. Furthermore, the controller 160 determines another time span according to the current predetermined condition and a history record for executing the next maintenance procedure, and determines a threshold of error bit value according to the history record. In one embodiment, the predetermined condition includes the current temperature parameter, and the history record includes the error bit value of the previous block scan and the number of the updated blocks in the previous maintenance procedure, but it is not limited thereto. In other embodiments, the current predetermined condition may further include the time of the last time that the data storage device 140 is accessed by the host 120, the time that the data storage device 140 has been powered on and/or the number of times that the blocks are erased. In the current maintenance procedure, the controller 160 may determines the time span according to the parameter table or the parameter function, such that the controller 160 can perform the following maintenance procedure after the determined time span since the current maintenance procedure is finished.

Next, in step S206, the controller 160 performs a block scan on the blocks according to the threshold of error bit value, wherein the controller 160 is arranged to perform the block scan on the blocks to obtain the error bit values corresponding to the blocks, respectively, and update the blocks when the corresponding error bit value is greater than the threshold of the error bit value. Next, the process returns to step S204.

Figure 3:
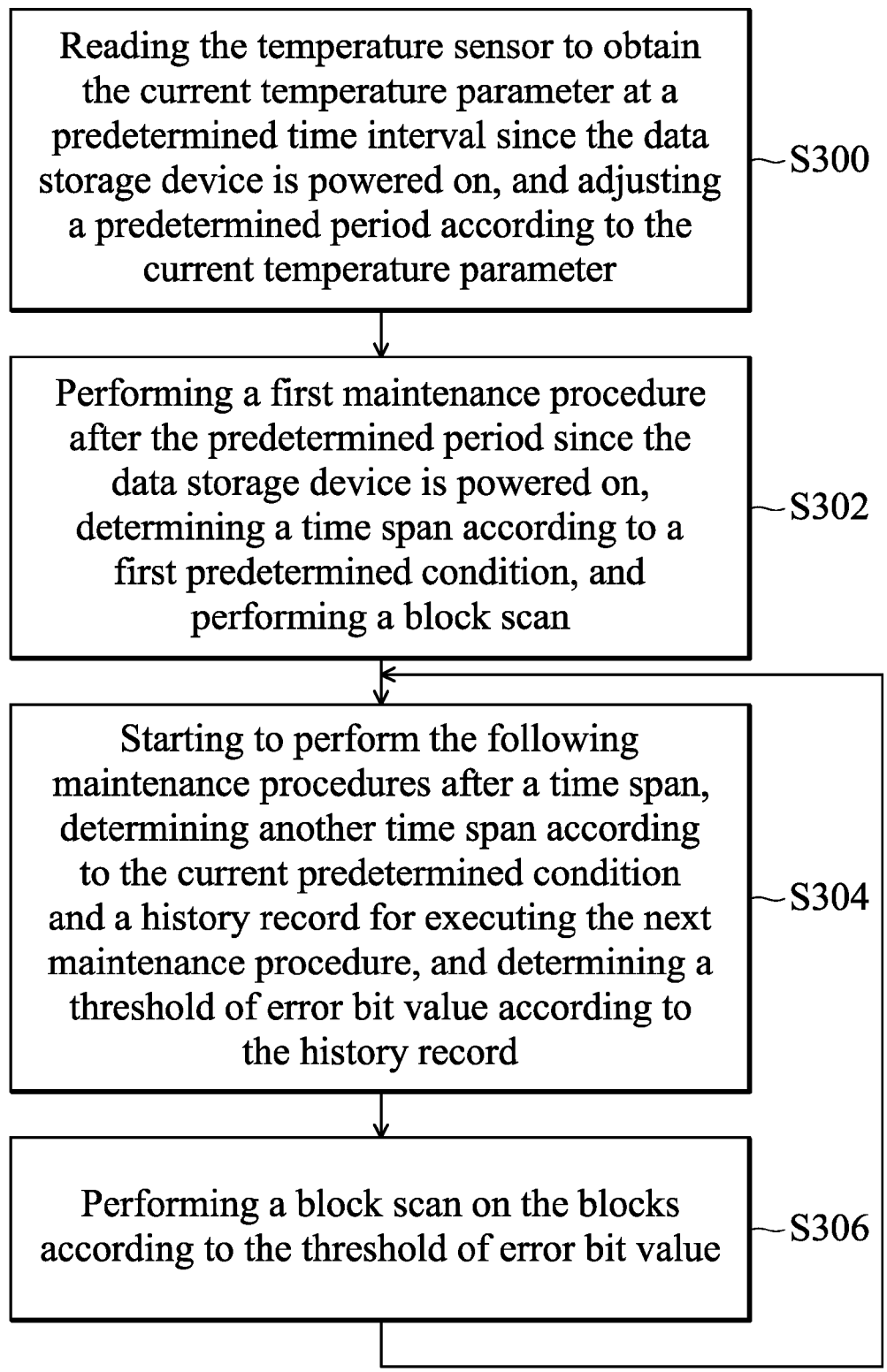
FIG. 3 is a flowchart of an access restriction method according to another embodiment of the present invention.

FIG. 3 is a flowchart of an access restriction method according to another embodiment of the present invention. The data maintenance method is applied to the data storage device 140 of FIG. 1. The process starts at step S300. It should be noted that the data maintenance method of FIG. 3 is similar to the data maintenance method of FIG. 2, except for the step S300. Therefore, the details of steps S302-S306 can be referred to in steps S202-S206.

In step S300, the controller 160 is arranged to read the temperature sensor 190 to obtain the current temperature parameter at a predetermined time interval since the data storage device 140 is powered on, and adjust the predetermined period according to the current temperature parameter, wherein the predetermined period is arranged to start the first maintenance procedure. Namely, the controller 160 is arranged to read the temperature sensor 190 to obtain the current temperature parameter at a predetermined time interval since the data storage device 140 is powered on, and determine the time arranged to start the first maintenance procedure by looking out the parameter table or the parameter function according to the current temperature parameter, wherein the span of the predetermined time interval is shorter than the predetermined period. For example, the predetermined period may be 1 second or 2 seconds, etc., but it is not limited thereto. When the determined time arranged to start the first maintenance procedure is less than the predetermined period, the controller 160 is further arranged to adjust the predetermined period according to the determined time arranged to start the first maintenance procedure. For example, the predetermined period may be 5 minutes, and the span of each predetermined time interval is 2 seconds. The controller 160 is arranged to read the temperature sensor 190 to obtain the current temperature parameter every 2 seconds for 5 minutes since the data storage device 140 is powered on, and determine the time arranged to enable the first maintenance procedure according to the current temperature parameter. For example, when the controller 160 determines that the first maintenance procedure should be started after 6 minutes (longer than the predetermined period) from the data storage device 140 being powered on, the controller 160 ignores the determined time (6 minutes) and repeats the steps of reading the temperature sensor 190 and determining the time span every 2 seconds until the predetermined period has ended. When the controller 160 determines that the first maintenance procedure should be started after 3 minutes (shorter than the predetermined period) from the data storage device 140 being powered on, the controller 160 adjusts the predetermined period to be 3 minutes and repeats the steps of reading the temperature sensor 190 and determining the time span every 2 seconds until the predetermined period has ended. Namely, the controller 160 performs the first maintenance procedure after 3 minutes since the data storage device 140 was powered on, and so on.

It will be seen from the above that the data storage device 140 and the data maintenance method can scan and update the blocks according to the current temperature.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, having a plurality of blocks, and each of the blocks has a plurality of pages;
a temperature sensor, arranged to detect surrounding ambient temperature and produce temperature parameters accordingly; and
a controller, configured to sequentially perform a plurality of maintenance procedures at different times during the flash memory is powered on, and scan the blocks to maintain data stored in the pages of the flash memory in the maintenance procedures, wherein the controller is configured to perform a first maintenance procedure of the plurality of maintenance procedures after a predetermined period from the time the data storage device is powered on, read the temperature sensor to obtain a first temperature parameter in the first maintenance procedure, determine a first time span according to a first predetermined condition, and perform a second maintenance procedure of the plurality of maintenance procedures after the first time span from the time the first maintenance procedure has finished, wherein the first predetermined condition comprises the first temperature parameter.

2. The data storage device as claimed in claim 1, wherein in the first maintenance procedure, the controller is further arranged to perform a first block scan on the blocks to obtain a plurality of first error bit values corresponding to the blocks, respectively, and update the blocks when the corresponding first error bit value is greater than a predetermined threshold of error bit value.

3. The data storage device as claimed in claim 1, wherein in the predetermined period, the controller is further arranged to read the temperature sensor to obtain the current temperature parameter at a predetermined time interval, and adjust the time arranged to start the first maintenance procedure according to the current temperature parameter.

4. The data storage device as claimed in claim 2, wherein in the second maintenance procedure, the controller is arranged to read the temperature sensor to obtain a second temperature parameter and determine a second time span according to a second predetermined condition and a first history record for performing a third maintenance procedure of the plurality of maintenance procedures, wherein the second predetermined condition comprises the second temperature parameter, and the first history record comprises the first error bit values and a number of the blocks which was updated in the first maintenance procedure.

5. The data storage device as claimed in claim 4, wherein in the second maintenance procedure, the controller is further arranged to determine a first threshold of error bit value according to the first history record, perform a second block scan on the blocks to obtain a plurality of second error bit values corresponding to the blocks, and update the blocks when the corresponding second error bit value is greater than the first threshold of error bit value.

6. The data storage device as claimed in claim 4, wherein the first predetermined condition and the second condition further comprise the time of the last time that a host accessed the data storage device.

7. The data storage device as claimed in claim 4, wherein the first predetermined condition and the second condition further comprise the time of the last time that the data storage device was powered on.

8. The data storage device is claimed in claim 4, wherein the first predetermined condition and the second condition further comprise the number of times that the blocks have been erased.

9. A data maintenance method, applied to a data storage device of a flash memory, wherein the flash memory has a plurality of blocks, each of the blocks has a plurality of pages, the data maintenance method is arranged to sequentially perform a plurality of maintenance procedures at different times during the flash memory is powered on and scan the blocks to maintain data stored in the pages of the flash memory in the maintenance procedures, the data maintenance method comprises:
  performing a first maintenance procedure of the plurality of maintenance procedures after a predetermined period from the time the data storage device was powered on;
  reading a temperature sensor to obtain a first temperature parameter in the first maintenance procedure;
  determining a first time span according to a first predetermined condition in the first maintenance procedure, wherein the first predetermined condition comprises the first temperature parameter; and
  performing a second maintenance procedure of the plurality of maintenance procedures after the first time span from the time the first maintenance procedure has finished.

10. The data maintenance method as claimed in claim 9, wherein the first maintenance procedure further comprises:
  performing a first block scan on the blocks to obtain a plurality of first error bit values corresponding to the blocks; and
  updating the blocks when the corresponding first error bit value is greater than a predetermined threshold of error bit value.

11. The data maintenance method as claimed in claim 10, further comprising:
  reading the temperature sensor to obtain the current temperature parameter at a predetermined time interval in the predetermined period; and
  adjusting the time arranged to start the first maintenance procedure according to the current temperature parameter.

12. The data maintenance method as claimed in claim 10, wherein the second maintenance procedure further comprises:
  reading the temperature sensor to obtain a second temperature parameter corresponding to the current surrounding ambient temperature; and
  determining a second time span according to a second predetermined condition and a first history record for performing a third maintenance procedure of the plurality of maintenance procedures, wherein the second predetermined condition comprises the second temperature parameter, and the first history record comprises the first error bit values and a number of the blocks which was updated in the first maintenance procedure.

13. The data maintenance method as claimed in claim 12, wherein the second maintenance procedure further comprises:
  determining a first threshold of error bit value according to the first history record;
  performing a second block scan on the blocks to obtain a plurality of second error bit values of the blocks; and
  updating the blocks when the corresponding second error bit value is greater than the first threshold of error bit value.

14. The data maintenance method as claimed in claim 12, wherein the first predetermined condition and the second condition further comprise the time of the last time that a host accesses the data storage device.

15. The data maintenance method as claimed in claim 12, wherein the first predetermined condition and the second condition further comprise the time of the last time that the data storage device was powered on.

16. The data maintenance method as claimed in claim 12, wherein the first predetermined condition and the second condition further comprise the number of times that the blocks have been erased.

* * * * *